(12) United States Patent
Imoto et al.

(10) Patent No.: US 10,008,588 B2
(45) Date of Patent: *Jun. 26, 2018

(54) METHOD FOR MANUFACTURING OXIDE SEMICONDUCTOR DEVICE

(71) Applicant: Semiconductor Energy Laboratory Co., Ltd., Atsugi-shi, Kanagawa-ken (JP)

(72) Inventors: Yuki Imoto, Atsugi (JP); Yuhei Sato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/583,416

(22) Filed: Dec. 26, 2014

(65) Prior Publication Data

US 2015/0162421 A1  Jun. 11, 2015

Related U.S. Application Data

(63) Continuation of application No. 13/424,681, filed on Mar. 20, 2012, now Pat. No. 8,927,329.

(30) Foreign Application Priority Data

Mar. 30, 2011 (JP) .................... 2011-074049

(51) Int. Cl.
    *H01L 29/66* (2006.01)
    *H01L 21/02* (2006.01)
    (Continued)

(52) U.S. Cl.
    CPC .... *H01L 29/66969* (2013.01); *H01L 21/0242* (2013.01); *H01L 21/02422* (2013.01);
    (Continued)

(58) Field of Classification Search
    None
    See application file for complete search history.

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

EP  0993032 A  4/2000
EP  1737044 A  12/2006
(Continued)

OTHER PUBLICATIONS

Sheldon, B.W. Silicon nitride oxidation based on oxynitride interlayers with graded stoichiometry, J. Am. Ceram. Soc., 79, 11 (1996) 2993-96.*

(Continued)

*Primary Examiner* — Thao X Le
*Assistant Examiner* — Gardner W Swan
(74) *Attorney, Agent, or Firm* — Eric J. Robinson; Robinson Intellectual Property Law Office, P.C.

(57) ABSTRACT

The amount of water and hydrogen contained in an oxide semiconductor film is reduced, and oxygen is supplied sufficiently from a base film to the oxide semiconductor film in order to reduce oxygen deficiencies. A stacked base film is formed, a first heat treatment is performed, an oxide semiconductor film is formed over and in contact with the stacked base film, and a second heat treatment is performed. In the stacked base film, a first base film and a second base film are stacked in this order. The first base film is an insulating oxide film from which oxygen is released by heating. The second base film is an insulating metal oxide film. An oxygen diffusion coefficient of the second base film is smaller than that of the first base film.

38 Claims, 13 Drawing Sheets

(51) Int. Cl.
*H01L 29/51* (2006.01)
*H01L 29/786* (2006.01)

(52) U.S. Cl.
CPC .. *H01L 21/02488* (2013.01); *H01L 21/02502* (2013.01); *H01L 21/02554* (2013.01); *H01L 21/02565* (2013.01); *H01L 21/02658* (2013.01); *H01L 29/513* (2013.01); *H01L 29/517* (2013.01); *H01L 29/7869* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,656,779 B1 | 12/2003 | Kasahara |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,138,657 B2 | 11/2006 | Kasahara |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,741,643 B2 | 6/2010 | Miyazaki et al. |
| 7,781,335 B2 | 8/2010 | Isono |
| 7,910,490 B2 | 3/2011 | Akimoto et al. |
| 7,932,521 B2 | 4/2011 | Akimoto et al. |
| 8,093,589 B2 | 1/2012 | Sugihara et al. |
| 8,129,719 B2 | 3/2012 | Yamazaki et al. |
| 8,143,115 B2 | 3/2012 | Omura et al. |
| 8,148,721 B2 | 4/2012 | Hayashi et al. |
| 8,304,300 B2 | 11/2012 | Sakata et al. |
| 8,343,817 B2 | 1/2013 | Miyairi et al. |
| 8,445,902 B2 | 5/2013 | Sato et al. |
| 8,461,594 B2 | 6/2013 | Morosawa et al. |
| 8,518,740 B2 | 8/2013 | Yamazaki et al. |
| 8,729,547 B2 | 5/2014 | Miyairi et al. |
| 8,735,884 B2 | 5/2014 | Sakata et al. |
| 8,742,418 B2 | 6/2014 | Morosawa et al. |
| 8,748,878 B2 | 6/2014 | Yamaguchi et al. |
| 8,822,264 B2 | 9/2014 | Yamazaki et al. |
| 8,945,981 B2 | 2/2015 | Yamazaki et al. |
| 8,946,703 B2 | 2/2015 | Miyairi et al. |
| 9,130,046 B2 | 9/2015 | Sakata et al. |
| 9,166,058 B2 | 10/2015 | Miyairi et al. |
| 9,196,713 B2 | 11/2015 | Yamazaki et al. |
| 9,236,456 B2 | 1/2016 | Miyairi et al. |
| 9,437,748 B2 | 9/2016 | Miyairi et al. |
| 9,793,416 B2 | 10/2017 | Miyairi et al. |
| 2001/0046027 A1 | 11/2001 | Tai et al. |
| 2001/0051444 A1* | 12/2001 | Lim .................... C23C 16/403 438/778 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091398 A1* | 5/2006 | Yamaguchi ......... H01L 27/1214 257/72 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063199 A1 | 3/2007 | Kasahara |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237600 A1 | 10/2008 | Miyazaki et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1* | 12/2008 | Son .................. H01L 29/7869 438/104 |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025677 A1 | 2/2010 | Yamazaki et al. |
| 2010/0035379 A1 | 2/2010 | Miyairi et al. |
| 2010/0044711 A1* | 2/2010 | Imai .................. H01L 27/14676 257/59 |
| 2010/0051940 A1 | 3/2010 | Yamazaki et al. |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

(56) References Cited

U.S. PATENT DOCUMENTS

| | | | |
|---|---|---|---|
| 2010/0136743 A1 | 6/2010 | Akimoto et al. | |
| 2010/0224871 A1 | 9/2010 | Yamaguchi et al. | |
| 2010/0295037 A1 | 11/2010 | Hironaka | |
| 2010/0308324 A1 | 12/2010 | Kim et al. | |
| 2011/0003418 A1* | 1/2011 | Sakata | H01L 21/02554 |
| | | | 438/34 |
| 2011/0003427 A1 | 1/2011 | Sasaki et al. | |
| 2011/0003430 A1 | 1/2011 | Yamazaki et al. | |
| 2011/0006301 A1 | 1/2011 | Yamazaki et al. | |
| 2011/0008930 A1 | 1/2011 | Sasaki et al. | |
| 2011/0042677 A1 | 2/2011 | Suzuki et al. | |
| 2011/0104851 A1 | 5/2011 | Akimoto et al. | |
| 2011/0111171 A1* | 5/2011 | Oyanagi | C30B 23/00 |
| | | | 428/131 |
| 2011/0115763 A1 | 5/2011 | Yamazaki et al. | |
| 2011/0117697 A1 | 5/2011 | Akimoto et al. | |
| 2011/0121290 A1 | 5/2011 | Akimoto et al. | |
| 2011/0163311 A1 | 7/2011 | Akimoto et al. | |
| 2011/0175090 A1 | 7/2011 | Sugihara et al. | |
| 2011/0180802 A1 | 7/2011 | Morosawa et al. | |
| 2012/0132908 A1 | 5/2012 | Sugihara et al. | |
| 2012/0168750 A1 | 7/2012 | Hayashi et al. | |
| 2013/0328044 A1 | 12/2013 | Yamazaki et al. | |
| 2015/0084048 A1 | 3/2015 | Hayashi et al. | |
| 2015/0091009 A1 | 4/2015 | Yamazaki et al. | |
| 2015/0325600 A1 | 11/2015 | Sakata et al. | |
| 2016/0079439 A1 | 3/2016 | Yamazaki et al. | |
| 2016/0225797 A1 | 8/2016 | Sakata et al. | |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2264745 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2007-096055 A | 4/2007 |
| JP | 2007-123861 A | 5/2007 |
| JP | 2008-270723 A | 11/2008 |
| JP | 2009-135380 A | 6/2009 |
| JP | 2010-045263 A | 2/2010 |
| JP | 2010-056541 A | 3/2010 |
| JP | 2010-062549 A | 3/2010 |
| JP | 2010-080947 A | 4/2010 |
| JP | 2010-114413 A | 5/2010 |
| JP | 2010-205987 A | 9/2010 |
| JP | 2010-272663 A | 12/2010 |
| JP | 2011-009415 A | 1/2011 |
| JP | 2011-029629 A | 2/2011 |
| JP | 2011-061227 A | 3/2011 |
| TW | 201005950 | 2/2010 |
| TW | 201025614 | 7/2010 |
| TW | 201110243 | 3/2011 |
| WO | WO-2004/114391 | 12/2004 |
| WO | WO-2008/069056 | 6/2008 |
| WO | WO-2008/069255 | 6/2008 |
| WO | WO-2009/136645 | 11/2009 |
| WO | WO-2010/041686 | 4/2010 |

OTHER PUBLICATIONS

Fortunato.E et al., "Wide-Bandgap High-Mobility ZnO Thin-Film Transistors Produced at Room Temperature", Appl. Phys. Lett. (Applied Pyhysics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '9: SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08: SID International Symposium Digest of Technical Papers, May 20, 2008.

(56) References Cited

OTHER PUBLICATIONS

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02: Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09: SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Gz—Zn—Oxide TFt", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composited for Display Applications", SID Digest '09: SID International Sympoisum Digest of Technical Papers, May 31, 2009, pp. 578-581.

Asaoka.Y at al., "29.1: Polarizer-Free Reflective LCD Combined With Ultra Low-Power Driving Technology", SID Digest '09: SID International Symposium Digest of Technical Papers, May 31, 2009, pp. 395-398.

Lee.H et al., "Current Status of, Challenges to, and Perspective View of AM-OLED", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H at al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. Eng.(Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Orita.M et al., "Mechanism of Electrical Conductivity of Transparent InGaZnO4", Phys. Rev. B.(Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of The 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol.B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 101110391) Dated Dec. 18, 2015.

Taiwanese Office Action (Application No. 105114131) dated Dec. 27, 2016.

Taiwanese Office Action (Application No. 106117663) dated Sep. 27, 2017.

\* cited by examiner

O(M/z=16)

O$_2$(M/z=32)

— SiOx=300nm
— SiOx\AlOx=300\5nm
······ SiOx\AlOx=300\10nm
- - - SiOx\AlOx=300\30nm

FIG. 10A    H(M/z=1)
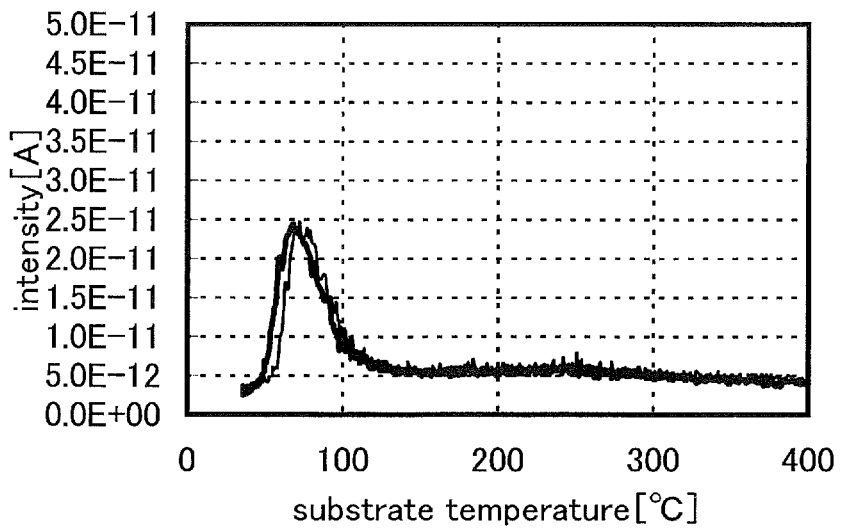
FIG. 10B    $H_2O$(M/z=18)
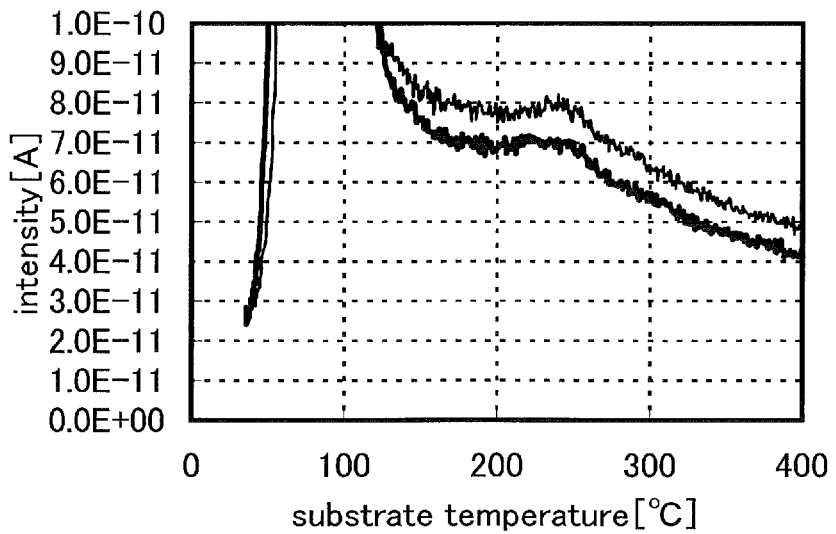
— $SiO_x$\\$AlO_x$=300\\5nm
— $SiO_X$\\$AlO_X$(baked at 300°C)=300\\5nm — SiOx\AlOx=300\5nm — SiO$_x$\AlO$_x$(baked at 300°C)=300\5nm FIG. 12A    O(M/z=16)
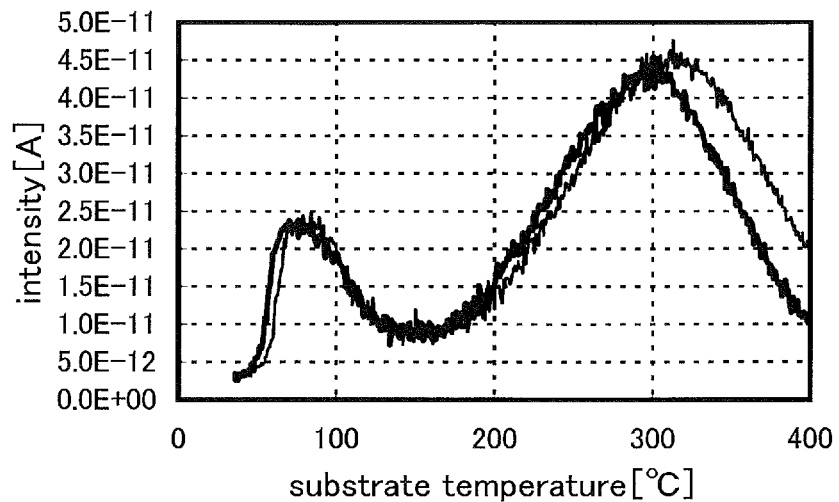
FIG. 12B    $O_2$(M/z=32)
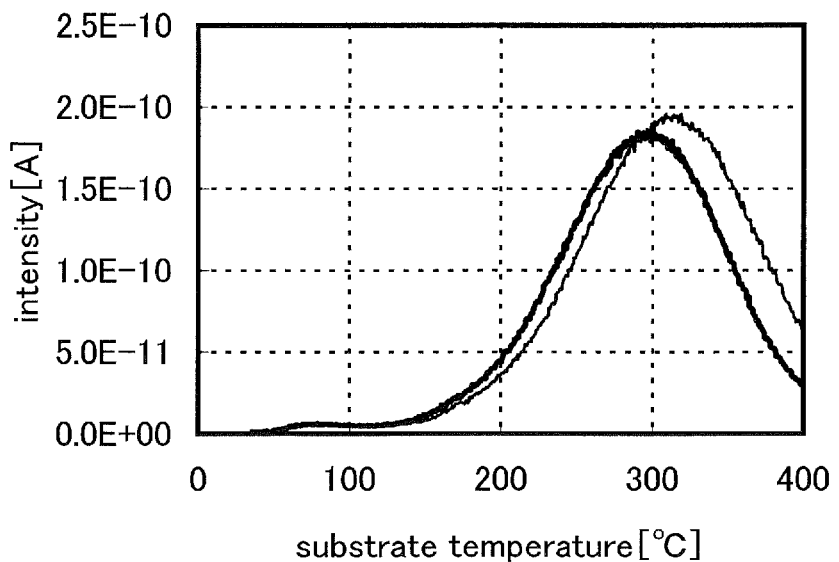
—— SiOx\AlOx=300\5nm
—— $SiO_x$\$AlO_x$(baked at 300°C)=300\5nm

METHOD FOR MANUFACTURING OXIDE SEMICONDUCTOR DEVICE

BACKGROUND OF THE INVENTION

1. Field of the Invention

The present invention relates to a method for manufacturing a semiconductor device. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as a liquid crystal display device.

2. Description of the Related Art

In recent years, a semiconductor device in which an oxide semiconductor film is used for a channel formation region has attracted great attention (see Patent Documents 1 and 2, for example).

REFERENCE

Patent Document

[Patent Document 1] Japanese Published Patent Application No. 2007-123861

[Patent Document 2] Japanese Published Patent Application No. 2007-096055

SUMMARY OF THE INVENTION

A semiconductor device in which an oxide semiconductor film is used for a channel formation region has favorable electric characteristics such as extremely high field-effect mobility as compared to a semiconductor device in which a silicon film is used for a channel formation region. However, such a semiconductor device has a problem in reliability. As one of factors of decrease in the reliability of a semiconductor device in which the oxide semiconductor film is used for a channel formation region, water and hydrogen contained in an oxide semiconductor film can be given. Therefore, it is important to reduce the amount of water and hydrogen contained in an oxide semiconductor film.

On the other hand, in a semiconductor device in which an oxide semiconductor film is used for a channel formation region, when many oxygen deficiencies are contained in the oxide semiconductor film, the resistance of a region where the oxygen deficiencies exist is reduced, which causes leakage current between a source and a drain. Accordingly, oxygen deficiencies in the oxide semiconductor film are preferably reduced. In order to reduce oxygen deficiencies, oxygen may be supplied from the outside.

One of methods for reducing the amount of water and hydrogen in an oxide semiconductor film and supplying oxygen in order to reduce oxygen deficiencies is, for example, heat treatment which is performed in a state where a base film containing oxygen is provided in contact with the oxide semiconductor film. By heat treatment in a state where the amount of water and hydrogen contained in the base film is reduced and the amount of oxygen contained in the base film is increased, oxygen can be supplied to the oxide semiconductor film while entry of water and hydrogen into the oxide semiconductor film is suppressed.

In order to reduce the amount of water and hydrogen contained in the base film, heat treatment may be performed after formation of the base film by a CVD method, a sputtering method, or the like before formation of the oxide semiconductor film. However, there is a problem in that when heat treatment is performed simply, oxygen is also desorbed together with water and hydrogen.

In view of this problem, it is an object of one embodiment of the present invention to provide a method for manufacturing a semiconductor device in which the amount of water and hydrogen contained in a base film provided in contact with an oxide semiconductor film is reduced and the amount of oxygen contained in the base film is increased, and thus, the amount of water and hydrogen contained in the oxide semiconductor film can be reduced, and oxygen can be supplied from the base film to the oxide semiconductor film in order to reduce oxygen deficiencies.

One embodiment of the present invention is a method for manufacturing a semiconductor device in which an oxide semiconductor film is used for a channel formation region. A method for manufacturing a semiconductor device according to one embodiment of the present invention includes the steps of forming a stacked base film; performing a first heat treatment; forming an oxide semiconductor film so as to be provided over and in contact with the stacked base film; and performing a second heat treatment. Further, in the stacked base film, a first base film and a second base film are stacked in this order, the first base film is an insulating oxide film from which oxygen is released by the second heat treatment, and the oxygen diffusion coefficient of the second base film is smaller than that of the first base film. Here, the first heat treatment is a step for desorbing water and hydrogen from the stacked base film while desorption of oxygen from the stacked base film is suppressed, and the second heat treatment is a step for supplying oxygen to the second base film using the first base film as a supply source of oxygen.

Another embodiment of the present invention is a method for manufacturing a semiconductor device including the steps of forming a first base film containing oxygen over a substrate; forming a second base film over the first base film; removing water and hydrogen contained in the first base film and the second base film by performing a first heat treatment on the substrate; forming an oxide semiconductor film over the second base film; supplying oxygen from the first base film to the oxide semiconductor film through the second base film by performing a second heat treatment on the substrate; processing the oxide semiconductor film to form an island-shaped oxide semiconductor film; forming a gate insulating film so as to cover the island-shaped oxide semiconductor film; forming a gate electrode over the gate insulating film so as to overlap with part of the island-shaped oxide semiconductor film; and forming a source electrode and a drain electrode connected to the island-shaped oxide semiconductor film. Further, the oxygen diffusion coefficient of the second base film is smaller than that of the first base film.

Another embodiment of the present invention is a method for manufacturing a semiconductor device including the steps of forming a first base film containing oxygen over a substrate; forming a second base film over the first base film; performing a first heat treatment on the substrate at higher than or equal to 250° C. and lower than or equal to 350° C.; forming an oxide semiconductor film over the second base film; performing a second heat treatment on the substrate at a temperature higher than a temperature of the first heat treatment and lower than or equal to 450° C.; processing the oxide semiconductor film to form an island-shaped oxide semiconductor film; forming a gate insulating film so as to cover the island-shaped oxide semiconductor film; forming a gate electrode over the gate insulating film so as to overlap with part of the island-shaped oxide semiconductor film; and forming a source electrode and a drain electrode connected to the island-shaped oxide semiconductor film. Further, the oxygen diffusion coefficient of the second base film is smaller than that of the first base film.

In the structure described above, the thickness of the second base film is preferably greater than or equal to 1 nm and less than or equal to 20 nm, more preferably, greater than or equal to 3 nm and less than or equal to 10 nm.

In the structure described above, as the first base film, a silicon oxide film can be used.

In the structure described above, as the second base film, for example, an insulating metal oxide film can be used. The metal oxide film is preferably any of an yttrium oxide film, a zirconium oxide film, an aluminum oxide film, and a zirconium oxide film to which yttrium oxide is added.

According to one embodiment of the present invention, the amount of water and hydrogen contained in an oxide semiconductor film can be reduced, and oxygen can be supplied to the oxide semiconductor film in order to reduce oxygen deficiencies, and thus, a highly reliable semiconductor device can be manufactured.

BRIEF DESCRIPTION OF THE DRAWINGS

In the accompanying drawings:

FIGS. 10A and 10B show the ion intensity with respect to substrate temperature in TDS analysis;

FIGS. 12A and 12B show the ion intensity with respect to substrate temperature in TDS analysis.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Embodiment 1

In this embodiment, a method for manufacturing a semiconductor device according to one embodiment of the present invention will be described.

Figure 1A:
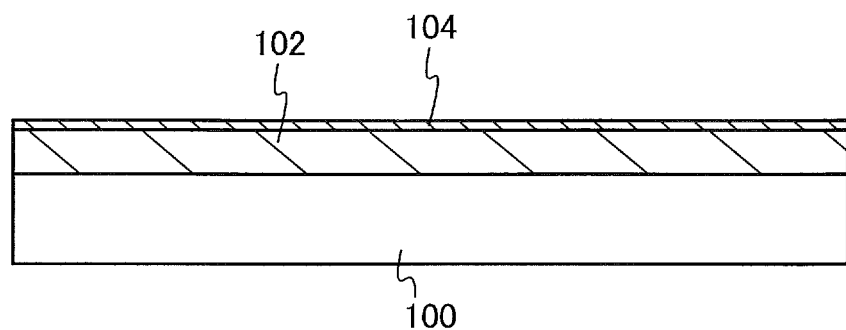
FIGS. 1A to 1C illustrate a method for manufacturing a semiconductor device according to one embodiment of the present invention.

First, a stacked base film including a first base film 102 and a second base film 104 is formed over a substrate 100 (see FIG. 1A). Next, a first heat treatment is performed after the second base film 104 is formed. The first heat treatment is a step in which water and hydrogen are desorbed from the stacked base film while desorption of oxygen from the stacked base film is suppressed.

As the substrate 100, a glass substrate (preferably a non-alkali glass substrate), a quartz substrate, a ceramic substrate, a plastic substrate, or the like can be used as appropriate. Alternatively, a flexible glass substrate or a flexible plastic substrate can be used as the substrate 100. For a plastic substrate, a material having low refractive index anisotropy is preferably used. For example, polyether sulfone (PES), a polyimide film, polyethylene naphthalate (PEN), polyvinyl fluoride (PVF), polyester, polycarbonate (PC), an acrylic resin, a prepreg which includes a fibrous body in a partially-cured organic resin, or the like can be used.

The first base film 102 contains oxygen at least in its surface and is formed using an insulating oxide from which part of the oxygen is desorbed by heat treatment. As an insulating oxide from which part of oxygen is desorbed by heat treatment, a material containing more oxygen than the stoichiometric proportion is preferably used. This is because oxygen can be diffused to an oxide semiconductor film in contact with the first base film 102 by heat treatment.

As an insulating oxide containing more oxygen than the stoichiometric proportion, silicon oxide represented by $SiO_X$ where X>2 can be given, for example. However, there is no limitation thereto, and the first base film 102 may be formed using silicon oxide, silicon oxynitride, silicon nitride oxide, aluminum oxide, aluminum oxynitride, gallium oxide, hafnium oxide, yttrium oxide, or the like.

Further, "silicon nitride oxide" contains more nitrogen than oxygen.

Note that "silicon oxynitride" contains more oxygen than nitrogen.

Note that the first base film 102 may be a stacked film. An example of the first base film 102 is a stacked film in which a silicon oxide film is provided over a silicon nitride film.

In an insulating oxide which contains more oxygen than the stoichiometric proportion, part of the oxygen is easily desorbed by heat treatment. The amount of oxygen desorbed from an insulating oxide which contains more oxygen than the stoichiometric proportion using TDS analysis (a value converted into the number of oxygen atoms) is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, a measurement method using the TDS analysis is described. The desorption amount of a gas according to the TDS analysis is proportional to a value obtained by time integration of ion intensity. Thus, using the value obtained by time integration of the ion intensity in the insulating oxide and a reference value of a standard sample which is a reference sample, the desorption amount of the gas can be calculated. The reference value of a standard sample refers to the ratio of the density of a predetermined atom contained in a sample (standard sample) to the value obtained by time integration of the ion intensity.

For example, using a value obtained by time integration of the ion intensity of a silicon wafer containing a predetermined density of hydrogen (standard sample) and a value obtained by time integration of the ion intensity of the insulating oxide, $N_{O2}$, which is the number ($N_{O2}$) of desorbed oxygen molecules ($O_2$) of the insulating oxide, can be obtained by the following formula (1).

Formula 1

$$N_{O2}=(N_{H2}/S_{H2}) \times S_{O2} \times \alpha \qquad (1)$$

$N_{H2}$ is a value obtained by conversion of the number of hydrogen molecules ($H_2$) desorbed from the standard sample into density. $S_{H2}$ is a value obtained by time integration of the ion intensity of hydrogen molecules ($H_2$) of the standard sample. In other words, the reference value of the standard sample is $N_{H2}/S_{H2}$. $S_{O2}$ is a value obtained by time integration of the ion intensity of oxygen molecules ($O_2$) of the insulating oxide. $\alpha$ is a coefficient affecting the ion intensity. Refer to Japanese Published Patent Application No. H6-275697 for details of Formula 1.

Note that, in the following description, the desorption amount of the oxygen obtained by TDS analysis (the value converted into the number of oxygen atoms) is measured with use of a silicon wafer containing hydrogen atoms at $1 \times 10^{16}$ atoms/cm$^3$ as the standard sample, by using a thermal desorption spectrometer, EMD-WA1000S/W manufactured by ESCO, Ltd.

Note that in the TDS analysis, oxygen is partly detected as an oxygen atom. The ratio between oxygen molecules and oxygen atoms can be calculated from the ionization rate of the oxygen molecules. Note that, since the coefficient $\alpha$ includes the ionization rate of the oxygen molecules, the number of the released oxygen atoms can also be calculated through the evaluation of the number of the released oxygen molecules.

In addition, $N_{O2}$ is the number of desorbed oxygen molecules ($O_2$). Therefore, the amount of desorbed oxygen converted into oxygen atoms is twice the number of desorbed oxygen molecules ($O_2$).

As described above, the number of desorbed oxygen atoms can be known.

The first base film 102 may be formed by a sputtering method, a CVD method, or the like, preferably a sputtering method. In the case where a silicon oxide film is formed as the first base film 102, a quartz (preferably, synthesized quartz) target may be used as a target, and an argon gas may be used as a sputtering gas. Alternatively, a silicon target and a gas containing oxygen may be used as a target and a sputtering gas, respectively. As a gas containing oxygen, a mixed gas of an argon gas and an oxygen gas may be used or only an oxygen gas may be used.

The thickness of the first base film 102 is greater than or equal to 50 nm and less than or equal to 600 nm, preferably greater than or equal to 150 nm and less than or equal to 500 nm.

The second base film 104 is an insulating film containing oxygen (preferably, an insulating metal oxide film). The oxygen diffusion coefficient of the second base film 104 is smaller than that of the first base film 102. Here, the coefficient is a value at a temperature in a second heat treatment.

As described later, since the second base film 104 (an aluminum oxide film in later description) whose oxygen diffusion coefficient is smaller than that of the first base film 102 at the temperature in the second heat treatment is provided over the first base film 102 (a silicon oxide film in later description) whose oxygen diffusion coefficient is large at the temperature in the second heat treatment, oxygen can be released from the second base film 104 at a high temperature as compared to the case of provision of only the first base film 102. Here, in the case where the oxygen diffusion coefficient of the second base film 104 is larger than that of the first base film 102 at the temperature in the second heat treatment, oxygen in the second base film 104 is released at a temperature lower than the temperature in the second heat treatment.

As a material film for forming the second base film 104, any of a chromium oxide film, a hafnium oxide film, an yttrium oxide film, a zirconium oxide film, a tantalum oxide film, a magnesium oxide film, an aluminum oxide film, and a zirconium oxide film to which yttrium oxide is added (a YSZ film) can be used, and it is preferable to use any of an yttrium oxide film, a zirconium oxide film, an aluminum oxide film, and a zirconium oxide film to which yttrium oxide is added.

The second base film 104 may be formed by a sputtering method, a CVD method, or the like, preferably a sputtering method.

The thickness of the second base film 104 may be greater than or equal to 1 nm and less than or equal to 20 nm, preferably greater than or equal to 3 nm and less than or equal to 10 nm.

The first heat treatment is a step in which while desorption of oxygen from the first base film 102 and the second base film 104 is suppressed, water and hydrogen are desorbed from the first base film 102 and the second base film 104. The temperature of the first heat treatment is higher than or equal to 250° C. and lower than or equal to 350° C.

Note that in this embodiment, it is particularly preferable that the first base film 102 be a silicon oxide film and the second base film 104 be an aluminum oxide film. In other words, it is particularly preferable that the stacked base film in which the first base film 102 and the second base film 104 are stacked be a stacked film in which an aluminum oxide film is provided over a silicon oxide film.

Here, the stacked film in which an aluminum oxide film is provided over a silicon oxide film, which is particularly preferable, will be described with reference to experimental data.

First, over the substrate 100, a silicon oxide film was formed as the first base film 102, an aluminum oxide film was formed as the second base film 104, and the first heat treatment was performed.

As the substrate 100, a non-alkali glass substrate was used.

As the first heat treatment, the substrate 100 was transferred to a chamber, the chamber was made vacuum, and the substrate 100 was heated at 400° C. for 10 minutes.

The silicon oxide film serving as the first base film 102 was formed by a sputtering method. As a sputtering target, a silicon oxide target was used. The silicon oxide film serving as the first base film 102 was formed to a thickness of 300 nm over the substrate 100 in such a manner that sputtering was performed under the conditions where an argon gas was introduced into the chamber at 25 sccm; an oxygen gas was introduced into the chamber at 25 sccm; the pressure in the chamber was 0.4 Pa; the power was 1.5 kW; and the temperature of the substrate 100 was 100° C.

The aluminum oxide film serving as the second base film 104 was also formed by a sputtering method. As a sputtering target, an aluminum oxide target was used. The aluminum oxide film serving as the second base film 104 was formed over the substrate 100 by sputtering under the conditions where an argon gas was introduced into the chamber at 25 sccm; an oxygen gas was introduced into the chamber at 25 sccm; the pressure in the chamber was 0.4 Pa; the power was 1.5 kW; and the temperature of the substrate 100 was 250° C.

Here, in a first sample, an aluminum oxide film serving as the second base film 104 was not formed.

In a second sample, an aluminum oxide film serving as the second base film 104 was formed to a thickness of 5 nm.

In a third sample, an aluminum oxide film serving as the second base film 104 was formed to a thickness of 10 nm.

In a fourth sample, an aluminum oxide film serving as the second base film 104 was formed to a thickness of 30 nm.

The substrates 100 of the first to fourth samples were heated from room temperature to 400° C., which was increased by 30° C. per minute, and subjected to TDS analysis. FIGS. 7A and 7B, FIG. 8, and FIGS. 9A and 9B show results of the TDS analysis. In each of FIGS. 7A and 7B, FIG. 8, and FIGS. 9A and 9B, the horizontal axis represents a substrate temperature (the Celsius temperature scale), and the vertical axis represents ion intensity ("A" is an abbreviation of "absolute" and represents an absolute value), that is, a desorption amount. Note that a hydrogen atom has a M/z value of 1, a water molecule has a M/z value of 18, a hydroxyl group has a M/z value of 17, an oxygen atom has a M/z value of 16, and an oxygen molecule has a M/z value of 32.

Figure 7A:
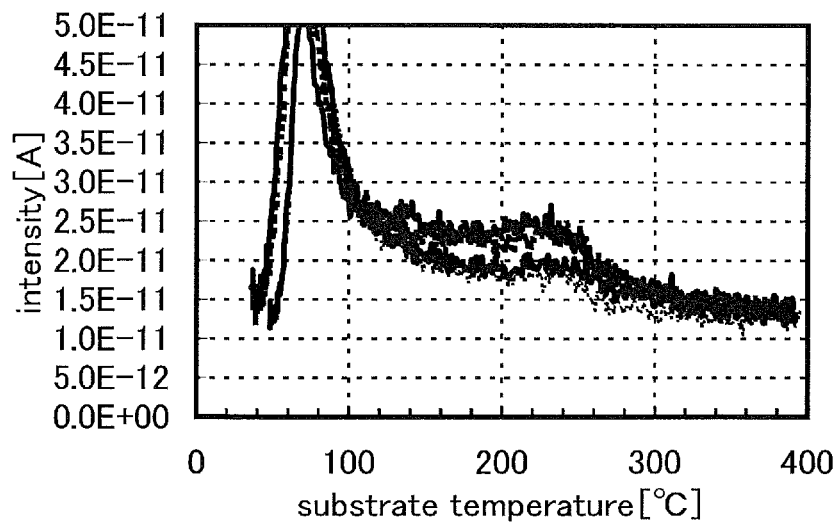
FIGS. 7A and 7B show the ion intensity with respect to substrate temperature in TDS analysis.

FIG. 7A shows the ion intensity of a hydrogen atom with respect to substrate temperature.

Figure 7B:
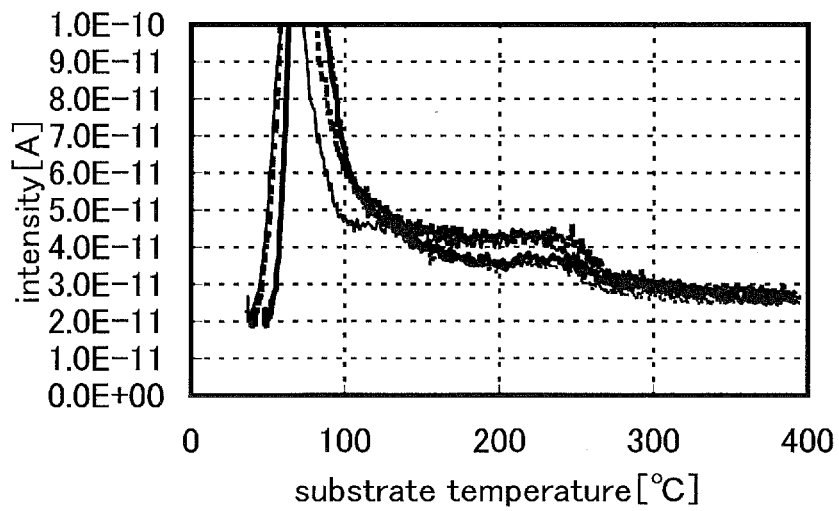

FIG. 7B shows the ion intensity of a water molecule with respect to substrate temperature.

Figure 8:
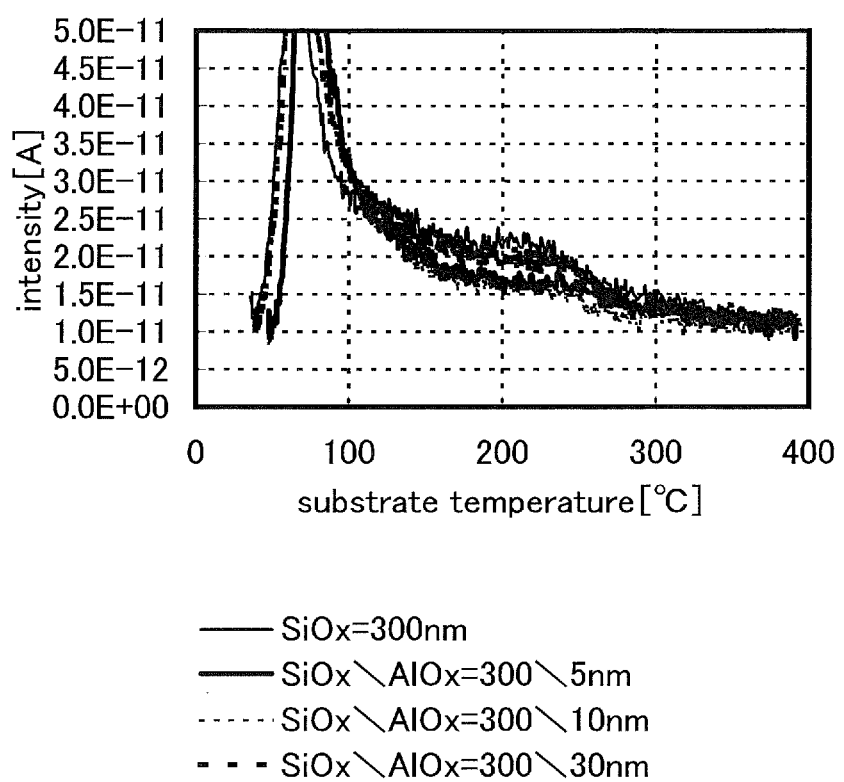
FIG. 8 shows the ion intensity with respect to substrate temperature in TDS analysis.

FIG. 8 shows the ion intensity of a hydroxyl group with respect to substrate temperature.

Figure 9A:
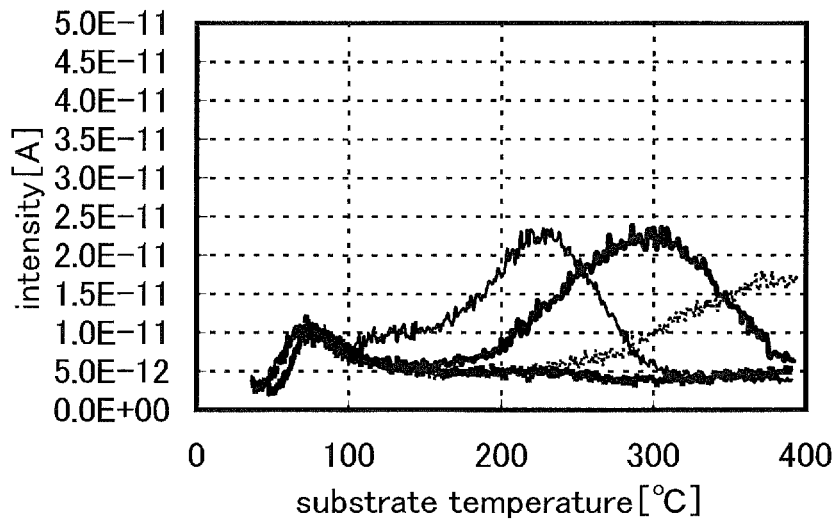
FIGS. 9A and 9B show the ion intensity with respect to substrate temperature in TDS analysis.

FIG. 9A shows the ion intensity of an oxygen atom with respect to substrate temperature.

Figure 9B:
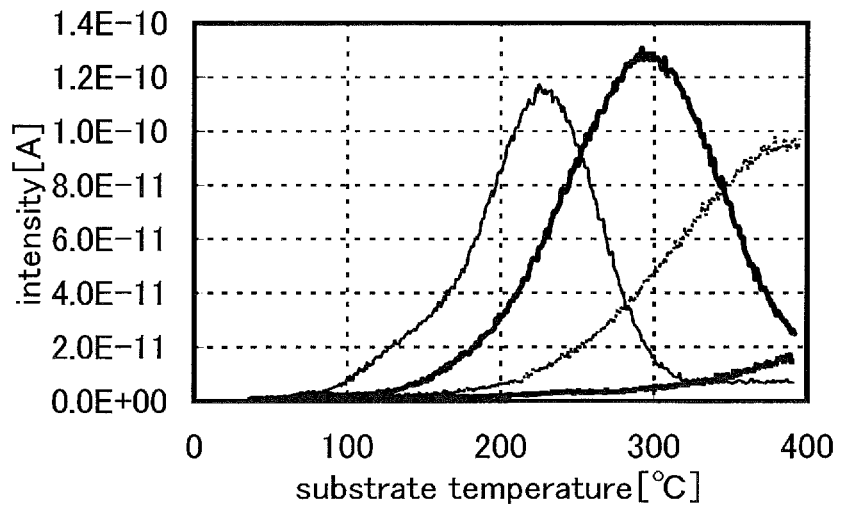

FIG. 9B shows the ion intensity of an oxygen molecule with respect to substrate temperature.

Note that in each of FIGS. 7A and 7B, FIG. 8, and FIGS. 9A and 9B, the first sample is expressed as "$SiO_x$=300 nm". The second sample is expressed as "$SiO_x\backslash AlO_x$=300\5 nm". The third sample is expressed as "$SiO_x\backslash AlO_x$=300\10 nm". The fourth sample is expressed as "$SiO_x\backslash AlO_x$=300\30 nm".

In each of FIGS. 7A and 7B and FIG. 8, there is no large difference among the first to fourth samples. On the other hand, in FIG. 9A (showing the ion intensity of an oxygen atom), the first sample has a peak at 200° C. to 250° C., the second sample has a peak at about 300° C., the third sample has a peak at about 400° C., and the fourth sample has no strong peak. In FIG. 9B (the ion intensity of an oxygen molecule) as well, the first sample has a peak at 200° C. to 250° C., the second sample has a peak at about 300° C., the third sample has a peak at about 400° C., and the fourth sample has no peak in a measurement range (to 400° C.).

In this manner, by provision of the aluminum oxide film over the silicon oxide film, the desorption amount of an oxygen molecule and an oxygen atom can be adjusted without changing the desorption amount of a hydrogen atom, a water molecule, and a hydroxyl group. For example, it can be said that in the second sample, the first heat treatment is performed at 250° C. to 300° C., whereby a hydrogen atom, a water molecule, and a hydroxyl group can be desorbed while desorption of oxygen in the stacked base film is suppressed. It can be said that in the third sample, the first heat treatment is performed at 250° C. to 350° C., whereby a hydrogen atom, a water molecule, and a hydroxyl group can be desorbed while desorption of oxygen in the stacked base film is suppressed. It can be said that in the fourth sample, the first heat treatment is performed at 250° C. to 400° C. (the temperature may exceed 400° C. depending on the case), whereby a hydrogen atom, a water molecule, and a hydroxyl group can be desorbed while desorption of oxygen in the stacked base film is suppressed. The second base film 104 is provided, and as the thickness of the second base film 104 is made larger, the temperature at which a large amount of oxygen is released can be shifted to a higher temperature side without a change in the temperature at which a hydrogen atom, a water molecule, and a hydroxyl group are desorbed.

Note that when the thickness of the second base film 104 is too large like the fourth sample, it is necessary to perform a second heat treatment at a temperature higher than 400° C. in order to extract oxygen from the stacked base film when oxygen is supplied from the stacked base film to the oxide semiconductor film in a later step. Thus, it is difficult to supply oxygen to the oxide semiconductor film in the second heat treatment performed later. Accordingly, the thickness of an aluminum oxide film serving as the second base film 104 is preferably less than or equal to 10 nm like the third sample, most preferably about 5 nm.

In the case where the thickness of an aluminum oxide film serving as the second base film 104 is about 5 nm which is the most preferable thickness, the first heat treatment can be performed at 250° C. to 300° C. Here, a comparison is made using a sample (Sample A) on which the first heat treatment was not performed and the TDS analysis was performed. FIGS. 10A and 10B, FIG. 11, and FIGS. 12A and 12B show results of the TDS analysis. In each of FIGS. 10A and 10B, FIG. 11, and FIGS. 12A and 12B, the horizontal axis represents a substrate temperature (the Celsius temperature scale), and the vertical axis represents ion intensity ("A" is an abbreviation of "absolute" and represents an absolute value), that is, a desorption amount. Note that a hydrogen atom has a M/z value of 1, a water molecule has a M/z value of 18, a hydroxyl group has a M/z value of 17, an oxygen atom has a M/z value of 16, and an oxygen molecule has a M/z value of 32.

FIG. 10A shows the ion intensity of a hydrogen atom with respect to substrate temperature.

FIG. 10B shows the ion intensity of a water molecule with respect to substrate temperature.

Figure 11:
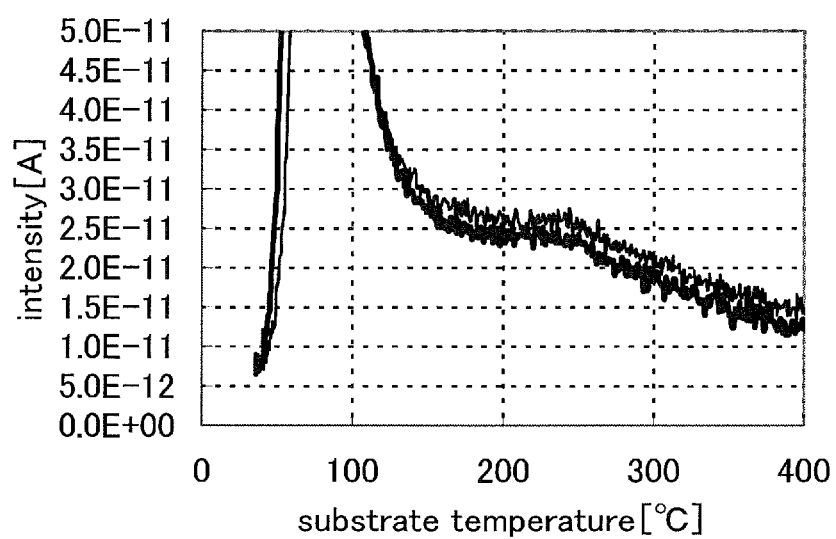
FIG. 11 shows the ion intensity with respect to substrate temperature in TDS analysis.

FIG. 11 shows the ion intensity of a hydroxyl group with respect to substrate temperature.

FIG. 12A shows the ion intensity of an oxygen atom with respect to substrate temperature.

FIG. 12B shows the ion intensity of an oxygen molecule with respect to substrate temperature.

In each of FIGS. 10A and 10B, FIG. 11, and FIGS. 12A and 12B, Sample A on which the first heat treatment was not performed is expressed as "$SiO_x\backslash AlO_x$=300\5 nm". Sample B in which the first heat treatment was performed at 300° C. is expressed as "$SiO_x\backslash AlO_x$ (baked at 300° C.)=300\5 nm".

Here, Sample A is a sample in which after an aluminum oxide film serving as the second base film 104 was formed to a thickness of 5 nm, the first heat treatment was not performed. Sample B is a sample in which after an aluminum oxide film serving as the second base film 104 was formed to a thickness of 5 nm, the first heat treatment was performed at 300° C.

Figure 13:
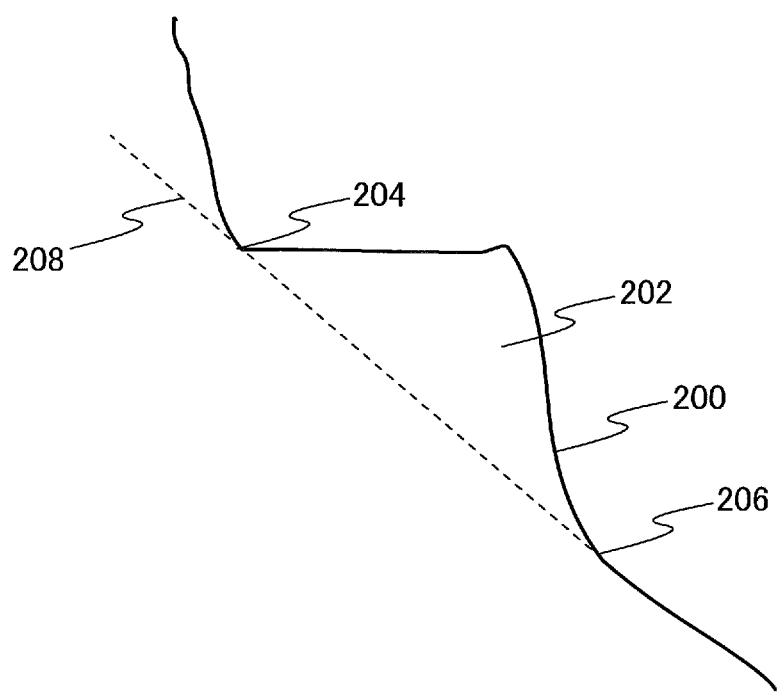
FIG. 13 is a diagram for complementing FIGS. 10A and 10B, FIG. 11, and FIGS. 12A and 12B.

Here, measurement of the desorption amount was performed as follows. A straight line 208 which is in contact with two points (a first contact 204 and a second contact 206) of a curved line 200 representing the ion intensity was drawn, and an enclosed region 202 surrounded by the curved line 200 and the straight line 208 is regarded as the desorption amount (see FIG. 13).

As shown in FIG. 10B, the number of water molecules desorbed from Sample B by an increase in temperature is smaller than that of water molecules desorbed from Sample A by an increase in temperature. This is because water molecules were removed in advance from Sample B by the first heat treatment (the heating temperature was 300° C.). As shown in FIGS. 12A and 12B (showing the number of desorbed oxygen atoms and the number of desorbed oxygen molecules), the number of oxygen atoms and oxygen molecules desorbed from Sample B on which the first heat treatment has already been performed is sufficiently large.

Accordingly, it can be said that by the first heat treatment, the amount of water or the like released at the time of the second heat treatment can be suppressed, and oxygen supplied by the second heat treatment can be sufficiently secured. In this embodiment, it is the most preferable that an aluminum oxide film serving as the second base film 104 be formed to have a thickness of 5 nm and the first heat treatment be performed at 300° C.

Figure 1B:
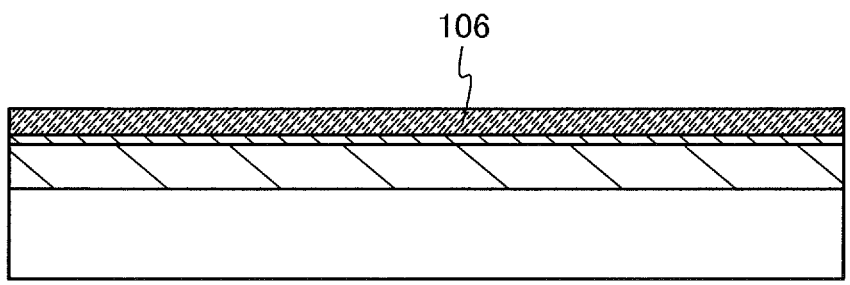

Next, an oxide semiconductor film 106 is formed over the second base film 104 on which the first heat treatment has already been performed (see FIG. 1B). Further, the second heat treatment is performed. The second heat treatment is a step for supplying oxygen to the second base film 104 with the use of the first base film 102 as a supply source of oxygen. Note that the timing of the second heat treatment is not limited thereto, and the second heat treatment may be performed after the oxide semiconductor film 106 is processed.

The oxide semiconductor film 106 may be formed using a metal oxide, for example, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, or a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Ga—O-based metal oxide. Alternatively, an In—O-based metal oxide, a Sn—O-based metal oxide, a Zn—O-based metal oxide, or the like may be used. Note that an n-component metal oxide includes n kinds of metal oxides. Here, for example, an In—Ga—Zn—O-based metal oxide means an oxide containing indium (In), gallium (Ga), and zinc (Zn), and there is no particular limitation on the composition ratio thereof. The In—Ga—Zn—O-based metal oxide may contain an element other than In, Ga, and Zn.

Note that it is preferable that oxygen (O) be excessively contained in the metal oxide as compared to oxygen in the stoichiometric proportion. When oxygen (O) is excessively contained, generation of carriers due to oxygen deficiency in the oxide semiconductor film 106 to be formed can be prevented.

Note that for example, in the case where the oxide semiconductor film 106 is formed using an In—Zn—O-based metal oxide, a target has a composition ratio where In/Zn is 1 to 100, preferably 1 to 20, more preferably 1 to 10 in an atomic ratio. When the atomic ratio of In with respect to Zn is in the above preferred range, the field-effect mobility can be improved. Here, when the atomic ratio of the compound is In:Zn:O=X:Y:Z, it is preferable to satisfy the relation of Z>1.5X+Y so that oxygen (O) is excessively contained.

Note that the energy gap of a metal oxide which can be applied to the oxide semiconductor film 106 is preferably greater than or equal to 2 eV, more preferably greater than or equal to 2.5 eV, still more preferably greater than or equal to 3 eV. In this manner, the off-state current of a transistor can be reduced by using a metal oxide having a wide band gap.

Note that the oxide semiconductor film 106 contains hydrogen. Note that the hydrogen may be contained in the oxide semiconductor film 106 in the form of a hydrogen molecule, water, a hydroxyl group, or hydride in some cases, in addition to a hydrogen atom. It is preferable that hydrogen contained in the oxide semiconductor film 106 be as little as possible.

Note that the concentrations of an alkali metal and an alkaline earth metal in the oxide semiconductor film 106 are preferably low, and these concentrations are preferably lower than or equal to $1\times10^{18}$ atoms/cm$^3$, more preferably lower than or equal to $2\times10^{16}$ atoms/cm$^3$. When an alkali metal and an alkaline earth metal are bonded to an oxide semiconductor, a carrier may be generated, which causes increase in the off-state current of the transistor.

Note that there is no particular limitation on the formation method and the thickness of the oxide semiconductor film 106, and they can be determined in consideration of the size or the like of a transistor to be manufactured. As an example of a method for forming the oxide semiconductor film 106, a sputtering method, a coating method, a printing method, a pulsed laser deposition method, or the like can be given. The thickness of the oxide semiconductor film 106 may be greater than or equal to 3 nm and less than or equal to 50 nm.

Here, as a preferable example, the oxide semiconductor film 106 is formed by a sputtering method using an In—Ga—Zn—O-based metal oxide target. A rare gas (for example, argon), an oxygen gas, or a mixed gas of a rare gas and an oxygen gas may be used as a sputtering gas.

It is preferable that a high-purity gas from which hydrogen, water, a hydroxyl group, or hydride is removed be used as the sputtering gas for the formation of the oxide semiconductor film 106. When the oxide semiconductor film 106 is formed while the substrate 100 is kept at high temperature, the concentration of impurities contained in the oxide semiconductor film 106 can be reduced. Here, the temperature of the substrate 100 is preferably higher than or equal to 100° C. and lower than or equal to 600° C., more preferably higher than or equal to 200° C. and lower than or equal to 400° C.

Note that the oxide semiconductor film 106 may have an amorphous structure or a crystalline structure. In the case where the oxide semiconductor film 106 has a crystalline structure, a c-axis aligned crystalline (CAAC) oxide semiconductor film is preferably used. When the oxide semiconductor film 106 is a CAAC oxide semiconductor film, the reliability of the transistor can be increased.

Note that a CAAC oxide semiconductor film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

In a broad sense, a CAAC oxide semiconductor film means a non-single-crystal oxide semiconductor film including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC oxide semiconductor film is not a single crystal, but this does not mean that the CAAC oxide semiconductor film is composed of only an amorphous component. Although the CAAC oxide semiconductor film includes a crystallized portion (crystalline portion), a boundary between one crystalline portion and another crystalline portion is not necessarily clear.

Nitrogen may be substituted for part of oxygen included in the CAAC oxide semiconductor film. The c-axes of individual crystalline portions included in the CAAC oxide semiconductor film may be aligned in one direction (e.g., a direction perpendicular to a surface of a substrate over which the CAAC oxide semiconductor film is formed, a surface of the CAAC oxide semiconductor film, or an interface of the CAAC oxide semiconductor film). Alternatively, normals of the a-b planes of individual crystalline portions included in the CAAC oxide semiconductor film may be aligned in one direction (e.g., a direction perpendicular to the surface of the substrate over which the CAAC oxide semiconductor film is formed, the surface of the CAAC oxide semiconductor film, or the interface of the CAAC oxide semiconductor film).

Note that the CAAC oxide semiconductor film may be a conductor, a semiconductor, or an insulator depending on its composition or the like. Further, the CAAC oxide semiconductor film may transmit or not transmit visible light depending on its composition or the like.

Here, a method for forming the CAAC oxide semiconductor film is described.

First, an oxide semiconductor film is formed by a sputtering method, a molecular beam epitaxy method, an atomic layer deposition method, a pulsed laser deposition method, or the like. Note that by forming an oxide semiconductor film while keeping the substrate 100 at high temperature, the ratio of a crystalline portion to an amorphous portion can be high. At this time, the temperature of the substrate 100 may be, for example, higher than or equal to 150° C. and lower than or equal to 450° C., preferably higher than or equal to 200° C. and lower than or equal to 350° C.

Here, the formed oxide semiconductor film may be subjected to a heat treatment. By the heat treatment, the ratio of a crystalline portion to an amorphous portion can be high. The temperature of the substrate 100 at the heat treatment is, for example, higher than or equal to 200° C. and lower than the strain point of the substrate 100, preferably higher than or equal to 250° C. and lower than or equal to 450° C. The time for the heat treatment may be longer than or equal to 3 minutes, and preferably shorter than or equal to 24 hours. This is because the productivity is decreased when the time for the heat treatment is longer, although the ratio of a crystalline portion to an amorphous portion can be high. Note that the heat treatment here may be performed in an oxidation atmosphere or an inert atmosphere; however, there is no limitation thereto. The heat treatment here may be performed under a reduced pressure.

In this embodiment, an oxidation atmosphere is an atmosphere containing an oxidizing gas. As an example of the oxidizing gas, oxygen, ozone, and nitrous oxide can be given. It is preferable that components (e.g. water and hydrogen) which are not preferably contained in the oxide semiconductor film be removed from the oxidation atmosphere as much as possible. For example, the purity of oxygen, ozone, or nitrous oxide is greater than or equal to 8N (99.999999%), preferably greater than or equal to 9N (99.9999999%).

The oxidation atmosphere may contain an inert gas such as a rare gas. Note that the oxidation atmosphere contains an oxidizing gas at a concentration of greater than or equal to 10 ppm.

Note that an inert atmosphere contains an inert gas (a nitrogen gas, a rare gas, or the like) and contains a reactive gas such as an oxidizing gas at a concentration of less than 10 ppm.

Note that a rapid thermal anneal (RTA) apparatus may be used for the heat treatments in this embodiment. With the use of the RTA apparatus, only in a short time, the heat treatments can be performed at a temperature of higher than or equal to the strain point of the substrate 100. Thus, the oxide semiconductor film having a high ratio of a crystalline portion to an amorphous portion can be formed and decrease in productivity can be suppressed.

However, the apparatus used for the heat treatments in this embodiment is not limited to an RTA apparatus; for example, an apparatus provided with a unit that heats an object to be processed by thermal conduction or thermal radiation from a resistance heater or the like may be used. As a heat treatment apparatus used for the heat treatments in this embodiment, for example, an electric furnace can be given. Alternatively, an RTA (rapid thermal anneal) apparatus such as a GRTA (gas rapid thermal anneal) apparatus or an LRTA (lamp rapid thermal anneal) apparatus can be used as the heat treatment apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

With use of an In—Ga—Zn—O-based metal oxide in which the nitrogen concentration is higher than or equal to $1\times10^{17}$ atoms/cm$^3$ and lower than or equal to $5\times10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

As described above, the CAAC oxide semiconductor film can be formed.

The CAAC oxide semiconductor film has high orderliness of a bond between metal and oxygen as compared to an oxide semiconductor film having an amorphous structure. In other words, in the case of an oxide semiconductor film having an amorphous structure, the number of oxygen atoms coordinated around an adjacent metal atom varies. In contrast, in the case of the CAAC oxide semiconductor film, the number of oxygen atoms coordinated around a metal atom is substantially the same. Therefore, oxygen deficiency is hardly observed even at a microscopic level, and charge transfer and instability of electric conductivity due to hydrogen atoms (including hydrogen ions), alkali metal atoms, or the like can be prevented.

Therefore, when a transistor has a channel formation region formed using a CAAC oxide semiconductor film, it is possible to suppress a change in the threshold voltage of the transistor between before and after light irradiation or a bias-temperature stress (BT) test performed on the transistor, so that the transistor can have stable electrical characteristics.

Figure 1C:
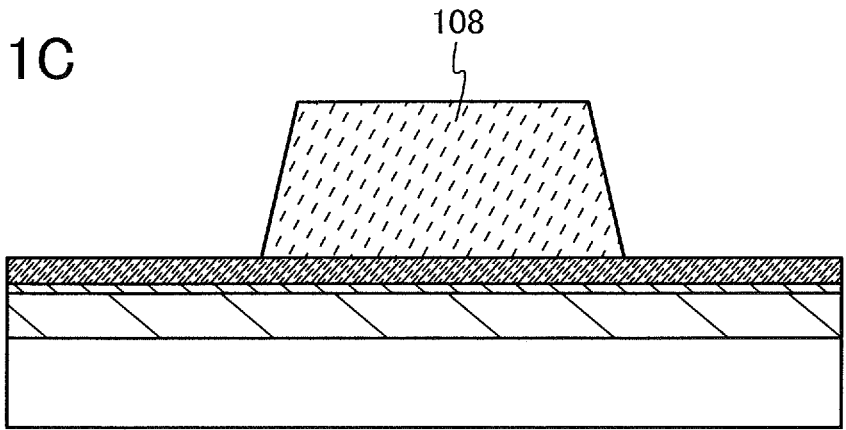

Next, a first mask 108 is formed at a predetermined position of the oxide semiconductor film 106 (see FIG. 1C).

The first mask 108 may be formed of a resist material. Note that there is no limitation thereto as long as it functions as a mask when the oxide semiconductor film 106 is processed.

Figure 2A:
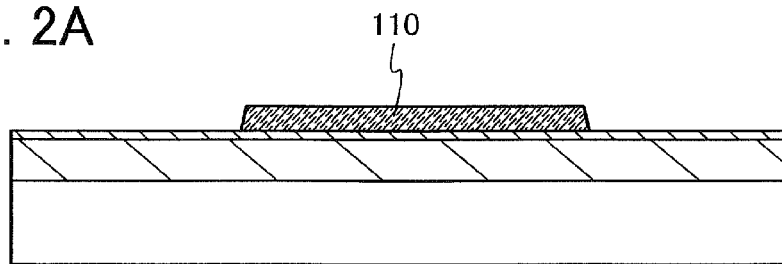
FIGS. 2A to 2C illustrate a method for manufacturing a semiconductor device according to one embodiment of the present invention.

Next, with the use of the first mask 108, the oxide semiconductor film 106 is processed to form an island-shaped oxide semiconductor film 110. After that, the first mask 108 is removed (see FIG. 2A).

Here, the oxide semiconductor film 106 may be processed by dry etching. For example, a chlorine gas or a mixed gas of a boron trichloride gas and a chlorine gas may be used as an etching gas used for the dry etching. However, there is no limitation thereto; wet etching may be used or another method capable of processing the oxide semiconductor film 106 may be used.

In the case where the first mask 108 is formed using a resist material, the first mask 108 may be removed with a resist stripper, or may be removed by only ashing.

Figure 2B:
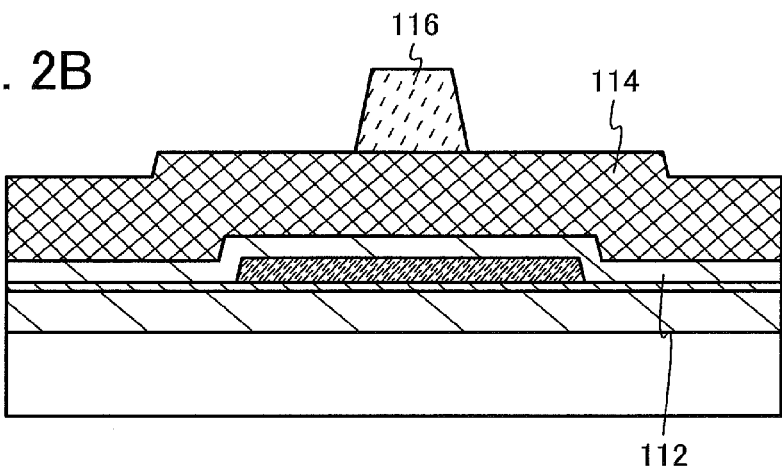

Next, a gate insulating film 112 is formed so as to cover the island-shaped oxide semiconductor film 110, a first conductive film 114 is formed over the gate insulating film 112, and a second mask 116 is formed over the first conductive film 114 (see FIG. 2B).

The gate insulating film 112 contains oxygen at least in a portion in contact with the island-shaped oxide semiconductor film 110 and is preferably formed using an insulating oxide from which part of the oxygen is desorbed by heating. In other words, the gate insulating film 112 is preferably formed using any of the materials exemplified as the material of the first base film 102. When the portion of the gate insulating film 112 which is in contact with the island-shaped oxide semiconductor film 110 is formed using silicon oxide, oxygen can be diffused into the island-shaped oxide semiconductor film 110 and reduction in the resistance of the transistor can be prevented.

Note that the gate insulating film 112 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, whereby gate leakage current can be reduced. Here, gate leakage current refers to leakage current which flows between a gate electrode and a source or drain electrode. Further, a layer formed using the high-k material and a layer formed using any of silicon oxide, silicon oxynitride, silicon nitride, silicon nitride oxide, aluminum oxide, aluminum oxynitride, and gallium oxide may be stacked. Note that even in the case where the gate insulating film 112 is a stacked film, the portion of the gate insulating film 112 which is in contact with the island-shaped oxide semiconductor film 110 is preferably formed using an insulating oxide.

The gate insulating film 112 may be formed by a sputtering method. The thickness of the gate insulating film 112 is greater than or equal to 1 nm and less than or equal to 300 nm, preferably greater than or equal to 5 nm and less than or equal to 50 nm. When the thickness of the gate insulating film 112 is greater than or equal to 5 nm, gate leakage current can be particularly reduced.

Note that it is preferable that before the gate insulating film 112 is formed, the surface of the island-shaped oxide semiconductor film 110 be exposed to plasma of an oxidizing gas to reduce oxygen deficiency on the surface of the island-shaped oxide semiconductor film 110.

The first conductive film 114 may be formed using a conductive material to have a single-layer structure or a stacked-layer structure including a plurality of layers. Here, as a conductive material, a metal such as aluminum, chromium, copper, tantalum, titanium, molybdenum, tungsten, manganese, magnesium, beryllium, or zirconium or an alloy containing one or more of the above metals as a component can be given. For example, a single-layer film of an aluminum film containing silicon, a two-layer stacked film in which a titanium film is provided over an aluminum film, a two-layer stacked film in which a titanium film is provided over a titanium nitride film, a two-layer stacked film in which a tungsten film is provided over a titanium nitride film, a two-layer stacked film in which a tungsten film is provided over a tantalum nitride film, a three-layer stacked film in which an aluminum film is interposed between titanium films, or the like can be given.

Note that the first conductive film 114 is preferably formed using copper because the resistance of a wiring formed by processing the first conductive film 114 can be reduced. Here, in the case where the first conductive film 114 is a stacked film, at least one layer of the first conductive film 114 is formed using copper.

Alternatively, the first conductive film 114 may be formed using a light-transmitting conductive material such as indium tin oxide, indium oxide containing tungsten oxide, indium zinc oxide containing tungsten oxide, indium oxide containing titanium oxide, indium tin oxide containing titanium oxide, or indium tin oxide to which indium zinc oxide or silicon oxide is added.

Alternatively, the first conductive film 114 may be formed by stacking a film of the light-transmitting conductive material and a film of the metal.

Note that there is no particular limitation on the formation method and the thickness of the first conductive film 114, and they can be determined in consideration of the size or the like of a transistor to be manufactured. As an example of a method for forming the first conductive film 114, a sputtering method, a CVD method, or the like can be given. The thickness of the first conductive film 114 may be, for example, greater than or equal to 100 nm and less than or equal to 300 nm.

The second mask 116 may be formed using a resist material. Note that there is no limitation thereto as long as it functions as a mask when the first conductive film 114 is processed.

Figure 2C:
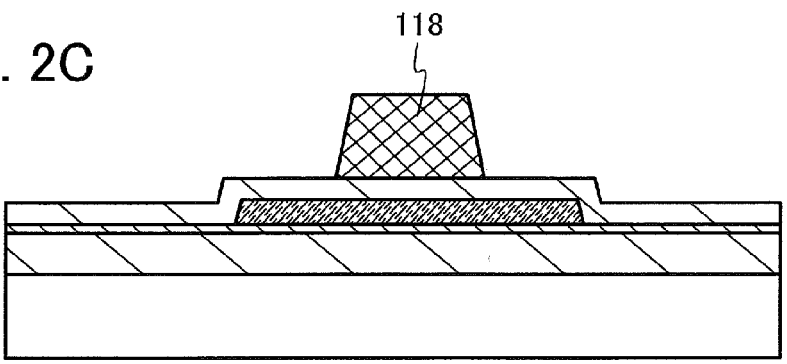

Next, with the use of the second mask 116, the first conductive film 114 is processed to form a gate electrode 118. After that, the second mask 116 is removed (see FIG. 2C).

Here, the first conductive film 114 may be processed by dry etching. For example, a chlorine gas or a mixed gas of a boron trichloride gas and a chlorine gas may be used as an etching gas used for the dry etching. However, there is no limitation thereto; wet etching may be used or another method capable of processing the first conductive film 114 may be used.

In the case where the second mask 116 is formed using a resist material, the second mask 116 may be removed with a resist stripper, or may be removed by only ashing.

Although not illustrated, it is preferable that after the second mask 116 is removed, a dopant be added to the island-shaped oxide semiconductor film 110 using the gate electrode 118 as a mask to form a source region and a drain region.

Note that, here, the dopant may be added by an ion implantation method or an ion doping method. Alternatively, the dopant may be added by performing plasma treatment in an atmosphere of a gas containing the dopant. As the added dopant, hydrogen, a rare gas, nitrogen, phosphorus, arsenic, or the like may be used.

Figure 3A:
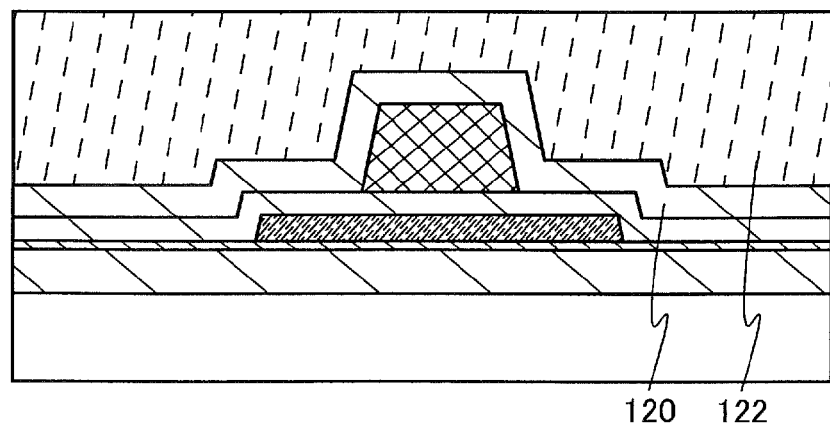
FIGS. 3A to 3C illustrate a method for manufacturing a semiconductor device according to one embodiment of the present invention.

Next, a first protective film 120 is formed over the gate insulating film 112 so as to cover the gate electrode 118, and a second protective film 122 is formed over the first protective film 120 (see FIG. 3A).

The first protective film 120 may be formed using a material and a method similar to those of the first base film 102 and the gate insulating film 112, and is preferably an insulating oxide film.

The first protective film 120 serves at least as a passivation film. Note that the first protective film 120 is not necessarily provided.

The second protective film 122 may be formed using an organic resin material such as photosensitive polyimide, acrylic resin, or epoxy resin, and is preferably a film formed by a method which makes a surface substantially planar (e.g. a spin coating method) or the like. Here, the phrase "substantially planar" may be at the level which can prevent defective formation of a film formed over the second protective film 122, and high planarity is not required.

The second protective film 122 serves as at least a planarization film. Note that the second protective film 122 is not necessarily provided.

Figure 3B:
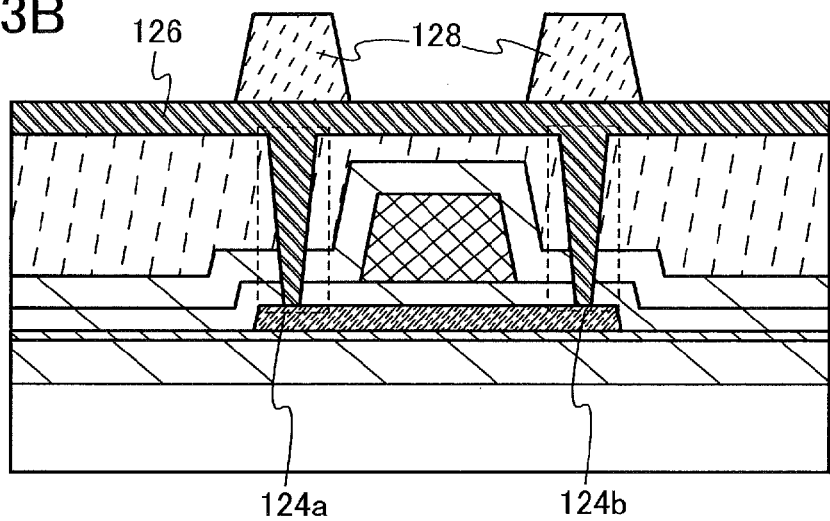

Next, the first protective film 120 and the gate insulating film 112 are processed at predetermined positions of the second protective film 122 to form an opening 124a and an opening 124b. A second conductive film 126 is formed so as to be connected to the island-shaped oxide semiconductor film 110 through the opening 124a and the opening 124b, and a third mask 128 is formed at a predetermined position over the second conductive film 126 (see FIG. 3B).

Here, there is no particular limitation on a method for forming the opening 124a and the opening 124b. For example, a mask may be formed at a predetermined position and dry etching may be performed. In the case where the second protective film 122 is formed using a photosensitive material, light exposure and development may be performed at a predetermined position of the second protective film 122, and dry etching may be performed using the second protective film 122 as a mask. For example, a chlorine gas or a mixed gas of a boron trichloride gas and a chlorine gas may be used as an etching gas used for the dry etching. However, there is no limitation thereto, and wet etching may be performed.

The second conductive film 126 may be formed using a material and a method similar to those of the first conductive film 114 and have substantially the same thickness as the first conductive film 114.

The third mask 128 may be formed using a resist material. Note that there is no limitation thereto as long as it functions as a mask when the second conductive film 126 is processed.

Figure 3C:
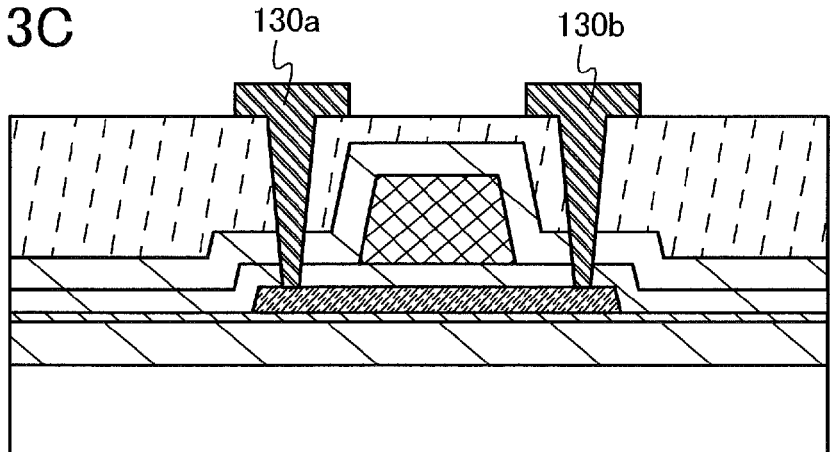

Next, the second conductive film 126 is processed using the third mask 128 to form a source electrode 130a and a drain electrode 130b, and after that, the third mask 128 is removed (see FIG. 3C).

By the method for manufacturing a semiconductor device according to one embodiment of the present invention, which is described in this embodiment, the amount of water and hydrogen contained in the stacked base film provided in contact with the island-shaped oxide semiconductor film is reduced, and the amount of oxygen contained in the stacked base film is increased. Thus, the amount of water and hydrogen contained in the oxide semiconductor film can be reduced, and oxygen can be supplied to the oxide semiconductor film in order to reduce oxygen deficiency, so that a highly reliable semiconductor device can be obtained.

Embodiment 2

The semiconductor device (transistor) described in Embodiment 1 can be used as a pixel transistor of a display device.

In a pixel transistor in this embodiment, an island-shaped transparent conductive film serving as a pixel electrode may be formed selectively so as to be connected to at least one of the source electrode 130a and the drain electrode 130b in the transistor which is formed by the manufacturing method described in Embodiment 1.

However, there is no limitation thereto, and the island-shaped transparent conductive film may be formed selectively by an ink-jet method so as to be connected to one of the source electrode 130a and the drain electrode 130b.

The transparent conductive film can be formed using a conductive composition containing a conductive high molecule (also referred to as a conductive polymer) having a light-transmitting property. It is preferable that the transparent conductive film formed using the conductive composition have a sheet resistance of less than or equal to 10000 Ω/square and a light transmittance of higher than or equal to 70% at a wavelength of 550 nm. Further, the resistivity of the conductive high molecule contained in the conductive composition is preferably less than or equal to 0.1 Ω·cm.

As the conductive high molecule, a so-called π electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof are given.

The transparent conductive film may be formed using, for example, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Embodiment 3

A semiconductor device according to one embodiment of the present invention, to which the semiconductor device of in Embodiment 1 or 2 is applied, includes electronic paper. Electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. An example of such electronic appliances is illustrated in FIG. 4.

Figure 4:
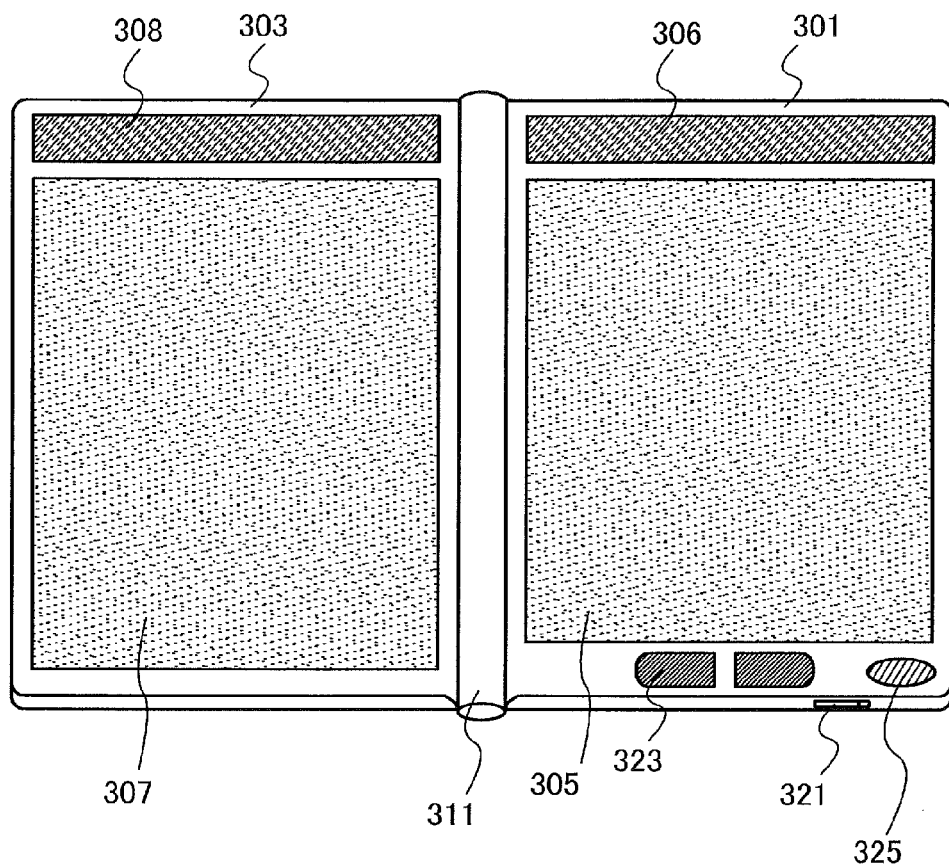
FIG. 4 illustrates a semiconductor device according to one embodiment of the present invention.

FIG. 4 illustrates an example of an electronic book reader. For example, an electronic book reader 300 includes two housings 301 and 303. The housings 301 and 303 are combined with each other with a hinge 311 so that the electronic book reader 300 can be opened and closed with the hinge 311 as an axis. With such a structure, the electronic book reader 300 can be handled like a paper book.

A display portion 305 and a photoelectric conversion device 306 are incorporated in the housing 301. A display portion 307 and a photoelectric conversion device 308 are incorporated in the housing 303. The display portions 305 and 307 may display one image or different images. In the case where the display portions 305 and 307 display different images, for example, a display portion on the right side (the display portion 305 in FIG. 4) can display text and a display portion on the left side (the display portion 307 in FIG. 4) can display images.

FIG. 4 illustrates an example in which the housing 301 includes an operation portion and the like. For example, the housing 301 includes a power source 321, operation keys 323, a speaker 325, and the like. Pages can be turned by the operation keys 323. Note that a keyboard, a pointing device, or the like may also be provided on the surface of the housing, on which the display portion is provided. Furthermore, an external connection terminal (an earphone terminal, a USB terminal, a terminal that can be connected to an AC adapter, various cables such as a USB cable, or the like), a recording medium insertion portion, and the like may be provided on the back surface or the side surface of the housing. Furthermore, the electronic book reader 300 may function as an electronic dictionary.

Further, the electronic book reader 300 may transmit and receive data wirelessly. Through wireless communication, desired book data or the like can be purchased and downloaded from an electronic book server.

Embodiment 4

A semiconductor device according to one embodiment of the present invention, to which the semiconductor device of Embodiment 1 or 2 is applied, includes a variety of electronic appliances (including game machines) besides electronic paper. Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 5A:
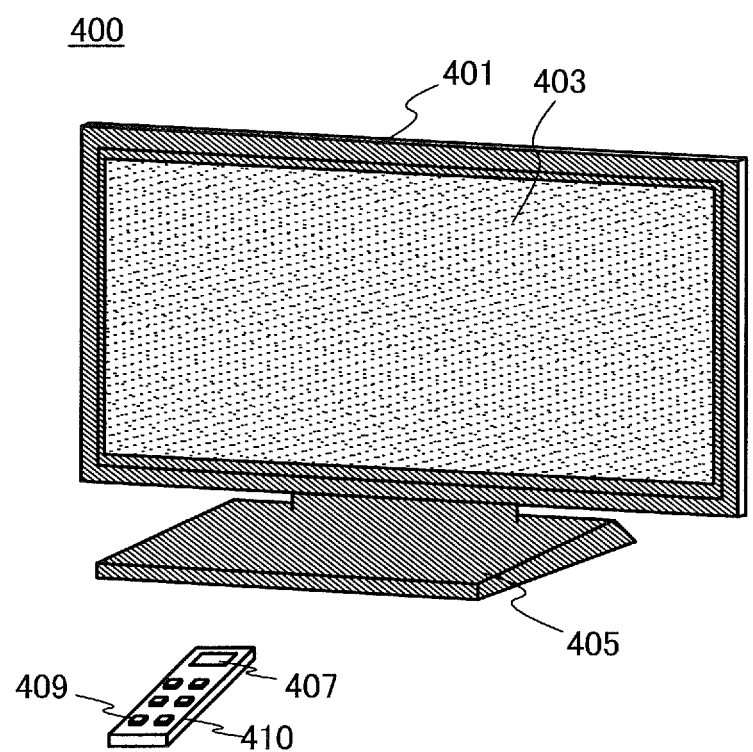
FIGS. 5A and 5B each illustrate a semiconductor device according to one embodiment of the present invention.

FIG. 5A illustrates an example of a television set. In a television set 400, a display portion 403 is incorporated in a housing 401. Images can be displayed on the display portion 403. Here, the housing 401 is supported by a stand 405.

The television set 400 can be operated by an operation switch of the housing 401 or a separate remote controller 410. Channels can be switched and volume can be controlled with operation keys 409 of the remote controller 410, whereby an image displayed on the display portion 403 can be controlled. The remote controller 410 may be provided with a display portion 407 for displaying data output from the remote controller 410.

Note that the television set 400 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 5B:
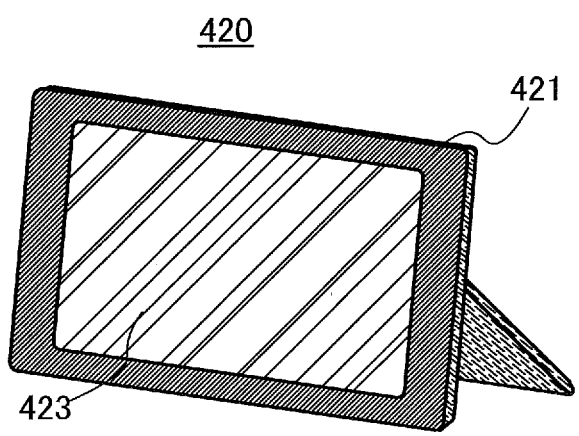

FIG. 5B illustrates an example of a digital photo frame. For example, a display portion 423 is incorporated in a housing 421 of a digital photo frame 420. The display portion 423 can display a variety of images. For example, the display portion 423 can display data of an image taken with a digital camera or the like and function as a normal photo frame.

Note that the digital photo frame 420 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 420. For example, a memory storing data of an image taken with a digital camera is inserted into the recording medium insertion portion of the digital photo frame and the image data is imported, whereby the imported image data can be displayed on the display portion 423.

The digital photo frame 420 may have a structure capable of wirelessly transmitting and receiving data. The structure may be employed in which desired image data is transferred wirelessly to be displayed.

Figure 6:
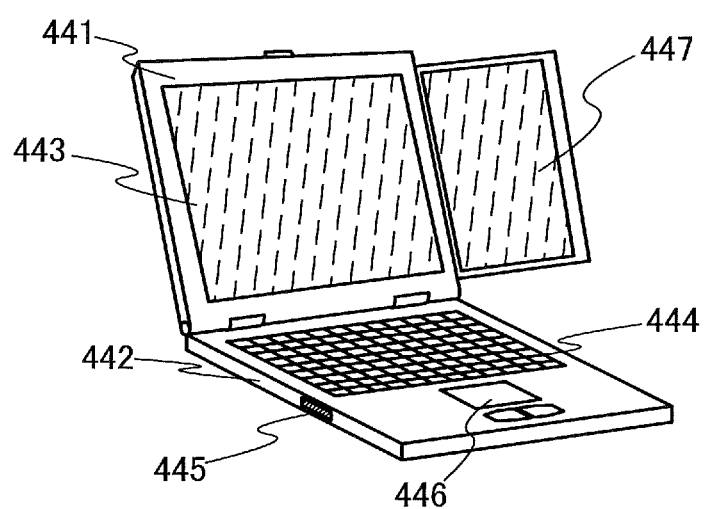
FIG. 6 illustrates a semiconductor device according to one embodiment of the present invention.

FIG. 6 is a perspective view illustrating an example of a portable computer.

In the portable computer of FIG. 6, a top housing 441 having a display portion 443 and a bottom housing 442 having a keyboard 444 can overlap with each other by closing a hinge unit which connects the top housing 441 and the bottom housing 442. The portable computer of FIG. 6 can be convenient for carrying, and in the case of using the keyboard for input, the hinge unit is opened and the user can input looking at the display portion 443.

The bottom housing 442 has a pointing device 446 with which input can be performed, in addition to the keyboard 444. When the display portion 443 is a touch screen, input can be performed by touching part of the display portion 443. The bottom housing 442 includes an arithmetic function portion such as a CPU or hard disk. In addition, the bottom housing 442 has an external connection port 445 into which another device, for example, a communication cable compliant with communication standards of a USB is inserted.

The top housing 441 further includes a display portion 447 which can be kept in the top housing 441 by being slid therein. Thus, a large display screen can be realized. In addition, the user can adjust the orientation of a screen of the display portion 447 which can be kept in the top housing 441. When the display portion 447 which can be kept in the top housing 441 is a touch screen, input can be performed by touching part of the display portion 447 which can be kept in the top housing 441.

The display portion 443 or the display portion 447 which can be kept in the top housing 441 is formed with an image display device such as a liquid crystal display panel or a light-emitting display panel including an organic light-emitting element, an inorganic light-emitting element, or the like.

In addition, the portable computer illustrated in FIG. 6 can include a receiver and the like and can receive a TV broadcast to display images on the display portion. The user can watch a television broadcast when the whole screen of the display portion 447 is exposed by sliding the display portion 447 and the angle of the screen is adjusted while the hinge unit which connects the top housing 441 and the bottom housing 442 is kept closed. In this case, the hinge unit is not opened and display is not performed on the display portion 443. In addition, start up of only a circuit for displaying television broadcast is performed. Therefore, power consumption can be the minimum, which is useful for the portable computer whose battery capacity is limited.

This application is based on Japanese Patent Application serial no. 2011-074049 filed with the Japan Patent Office on Mar. 30, 2011, the entire contents of which are hereby incorporated by reference.

What is claimed is:

1. A method for manufacturing a semiconductor device comprising:
    forming an insulating film over a substrate;
    forming an insulating metal oxide film over the insulating film;
    after forming the insulating metal oxide film, performing a first heat treatment;
    after performing the first heat treatment, forming an oxide semiconductor film over the insulating metal oxide film; and
    after forming the oxide semiconductor film, performing a second heat treatment,
    wherein an oxygen diffusion coefficient of the insulating metal oxide film is smaller than that of the insulating film,
    wherein the second heat treatment is performed lower than or equal to 450° C.,
    wherein the first heat treatment is performed at a temperature lower than the second heat treatment, and
    wherein oxygen is supplied from the insulating film to the oxide semiconductor film through the insulating metal oxide film by performing the second heat treatment.

2. The method according to claim 1, wherein water and hydrogen in the insulating film and the insulating metal oxide film is removed while desorption of oxygen from the insulating film and the insulating metal oxide film is suppressed during the first heat treatment.

3. The method according to claim 1, wherein a thickness of the insulating metal oxide film is greater than or equal to 1 nm and less than or equal to 20 nm.

4. The method according to claim 1, wherein the insulating film is a silicon oxide film.

5. The method according to claim 1, wherein the insulating metal oxide film is any one of an yttrium oxide film, a zirconium oxide film, an aluminum oxide film, and a zirconium oxide film to which yttrium oxide is added.

6. The method according to claim 1, wherein the oxide semiconductor film comprises indium, gallium, and zinc.

7. The method according to claim 1, wherein the oxide semiconductor film is formed to have a crystalline structure.

8. A method for manufacturing a semiconductor device comprising:
    forming an insulating film over a substrate;
    forming an insulating metal oxide film over the insulating film;
    after forming the insulating metal oxide film, performing a first heat treatment;
    after performing the first heat treatment, forming an oxide semiconductor film over the insulating metal oxide film; and
    after forming the oxide semiconductor film, performing a second heat treatment,
    wherein an oxygen diffusion coefficient of the insulating metal oxide film is smaller than that of the insulating film,
    wherein the first heat treatment is performed higher than or equal to 250° C. and lower than or equal to 350° C.,
    wherein the second heat treatment is performed lower than or equal to 450° C.,
    wherein the first heat treatment is performed at a temperature lower than the second heat treatment, and
    wherein oxygen is supplied from the insulating film to the oxide semiconductor film through the insulating metal oxide film by performing the second heat treatment.

9. The method according to claim 8, wherein water and hydrogen in the insulating film and the insulating metal oxide film is removed while desorption of oxygen from the insulating film and the insulating metal oxide film is suppressed during the first heat treatment.

10. The method according to claim 8, wherein a thickness of the insulating metal oxide film is greater than or equal to 1 nm and less than or equal to 20 nm.

11. The method according to claim 8, wherein the insulating film is a silicon oxide film.

12. The method according to claim 8, wherein the insulating metal oxide film is any one of an yttrium oxide film, a zirconium oxide film, an aluminum oxide film, and a zirconium oxide film to which yttrium oxide is added.

13. The method according to claim 8, wherein the oxide semiconductor film comprises indium, gallium, and zinc.

14. The method according to claim 8, wherein the oxide semiconductor film is formed to have a crystalline structure.

15. A method for manufacturing a semiconductor device comprising:
    forming an insulating film over a substrate;
    forming an insulating metal oxide film over the insulating film;
    after forming the insulating metal oxide film, performing a first heat treatment;
    after performing the first heat treatment; forming an oxide semiconductor film over the insulating metal oxide film;
    after forming the oxide semiconductor film, performing a second heat treatment;
    forming a gate insulating film over the oxide semiconductor film; and
    forming a gate electrode over the gate insulating film,
    wherein an oxygen diffusion coefficient of the insulating metal oxide film is smaller than that of the insulating film,
    wherein the first heat treatment is performed higher than or equal to 250° C. and lower than or equal to 350° C.,
    wherein the second heat treatment is performed lower than or equal to 450° C.,
    wherein the first heat treatment is performed at a temperature lower than the second heat treatment, and
    wherein oxygen is supplied from the insulating film to the oxide semiconductor film through the insulating metal oxide film by performing the second heat treatment.

16. The method according to claim 15, wherein water and hydrogen in the insulating film and the insulating metal oxide film is removed while desorption of oxygen from the insulating film and the insulating metal oxide film is suppressed during the first heat treatment.

17. The method according to claim 15, wherein a thickness of the insulating metal oxide film is greater than or equal to 1 nm and less than or equal to 20 nm.

18. The method according to claim 15, wherein the insulating film is a silicon oxide film.

19. The method according to claim 15, wherein the insulating metal oxide film is any one of an yttrium oxide film, a zirconium oxide film, an aluminum oxide film, and a zirconium oxide film to which yttrium oxide is added.

20. The method according to claim 15, wherein the oxide semiconductor film comprises indium, gallium, and zinc.

21. The method according to claim 15, wherein the oxide semiconductor film is formed to have a crystalline structure.

22. A method for manufacturing a semiconductor device comprising:
- forming an insulating film over a substrate;
- forming an insulating metal oxide film over the insulating film;
- after forming the insulating metal oxide film, performing a first heat treatment;
- after performing the first heat treatment, forming an oxide semiconductor film over the insulating metal oxide film; and
- after forming the oxide semiconductor film, performing a second heat treatment,
- wherein an oxygen diffusion coefficient of the insulating metal oxide film is smaller than that of the insulating film,
- wherein the second heat treatment is performed lower than or equal to 450° C., and
- wherein the first heat treatment is performed at a temperature lower than the second heat treatment.

23. The method according to claim 22, wherein the first heat treatment is performed higher than or equal to 250° C. and lower than or equal to 350° C.

24. The method according to claim 22, comprising:
- forming a gate insulating film over the oxide semiconductor film; and
- forming a gate electrode over the gate insulating film.

25. The method according to claim 22, wherein water and hydrogen in the insulating film and the insulating metal oxide film is removed while desorption of oxygen from the insulating film and the insulating metal oxide film is suppressed during the first heat treatment.

26. The method according to claim 22, wherein a thickness of the insulating metal oxide film is greater than or equal to 1 nm and less than or equal to 20 nm.

27. The method according to claim 22, wherein the insulating film is a silicon oxide film.

28. The method according to claim 22, wherein the insulating metal oxide film is any one of an yttrium oxide film, a zirconium oxide film, an aluminum oxide film, and a zirconium oxide film to which yttrium oxide is added.

29. The method according to claim 22, wherein the oxide semiconductor film comprises indium, gallium, and zinc.

30. The method according to claim 22, wherein the oxide semiconductor film is formed to have a crystalline structure.

31. A method for manufacturing a semiconductor device comprising:
- forming an insulating film over a substrate;
- forming an oxide insulating film over the insulating film;
- after forming the oxide insulating film, performing a first heat treatment;
- after performing the first heat treatment, forming an oxide semiconductor film over the oxide insulating film; and
- after forming the oxide semiconductor film, performing a second heat treatment,
- wherein an oxygen diffusion coefficient of the oxide insulating film is smaller than that of the insulating film,
- wherein the second heat treatment is performed lower than or equal to 450° C., and
- wherein the first heat treatment is performed at a temperature lower than the second heat treatment.

32. The method according to claim 31, wherein the first heat treatment is performed higher than or equal to 250° C. and lower than or equal to 350° C.

33. The method according to claim 31, comprising:
- forming a gate insulating film over the oxide semiconductor film; and
- forming a gate electrode over the gate insulating film.

34. The method according to claim 31, wherein water and hydrogen in the insulating film and the oxide insulating film is removed while desorption of oxygen from the insulating film and the oxide insulating film is suppressed during the first heat treatment.

35. The method according to claim 31, wherein a thickness of the oxide insulating film is greater than or equal to 1 nm and less than or equal to 20 nm.

36. The method according to claim 31, wherein the insulating film is a silicon oxide film.

37. The method according to claim 31, wherein the oxide semiconductor film comprises indium, gallium, and zinc.

38. The method according to claim 31, wherein the oxide semiconductor film is formed to have a crystalline structure.

* * * * *